United States Patent
Kaitila et al.

(10) Patent No.: US 6,812,619 B1
(45) Date of Patent: Nov. 2, 2004

(54) RESONATOR STRUCTURE AND A FILTER COMPRISING SUCH A RESONATOR STRUCTURE

(75) Inventors: Jyrki Kaitila, Helsinki (FI); Markku Ylilammi, Espoo (FI); Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/031,579
(22) PCT Filed: Jun. 29, 2000
(86) PCT No.: PCT/FI00/00591
§ 371 (c)(1), (2), (4) Date: Jan. 17, 2002
(87) PCT Pub. No.: WO01/06647
PCT Pub. Date: Jan. 25, 2001

(30) Foreign Application Priority Data

Jul. 19, 1999 (FI) .................................................. 991619

(51) Int. Cl.[7] .............................................. H01I 41/08
(52) U.S. Cl. ...................................... 310/320; 324/365
(58) Field of Search ............................... 310/320, 324, 310/312, 369, 365

(56) References Cited

U.S. PATENT DOCUMENTS

| | | | |
|---|---|---|---|
| 4,468,582 A | 8/1984 | Fujiwara et al. | 310/312 |
| 4,783,821 A * | 11/1988 | Muller et al. | 381/173 |
| 4,870,313 A | 9/1989 | Hirama et al. | 310/320 |
| 4,924,131 A * | 5/1990 | Nakayama et al. | 310/321 |
| 5,373,268 A | 12/1994 | Dworsky et al. | 333/187 |
| 5,884,378 A | 3/1999 | Dydyk | 29/25.35 |
| 5,910,756 A * | 6/1999 | Ella | 333/133 |
| 6,111,341 A * | 8/2000 | Hirama | 310/365 |
| 6,476,536 B1 * | 11/2002 | Pensala | 310/312 |
| 6,486,751 B1 * | 11/2002 | Barber et al. | 333/187 |

FOREIGN PATENT DOCUMENTS

| | | |
|---|---|---|
| EP | 0962999 A2 | 12/1999 |
| EP | 0963000 A2 | 12/1999 |
| WO | WO 99/59244 | 11/1999 |

OTHER PUBLICATIONS

"Acoustic Bulk Wave Composite Resonators", Lakin et al, 1981, Applied Physics Letters, vol. 38, No. 3.

(List continued on next page.)

Primary Examiner—Mark Budd
(74) Attorney, Agent, or Firm—Perman & Green, LLP

(57) ABSTRACT

A resonator structure (1200, 1300, 1400), where a certain wave mode is piezoelectrically excitable, comprises at least two conductor layers (110, 120) and at least one piezoelectric layer (110) in between the conductor layers, said conductor layers and piezoelectric layer extending over a first area of the resonator structure, which first area is a piezoelectrically excitable area of the resonator structure. The resonator structure is characterized in that it comprises a frame-like zone (2, 4) confining a center area (3) within the first area, a cut-off frequency of the piezoelectrically excited wave mode in the layer structure of the frame-like zone is different from that in the layer structure of the center area, and width of the frame-like zone and acoustical properties of the layer structure in the frame-like zone are arranged so that displacement relating to the piezoelectrically excited strongest resonance mode is substantially uniform in the center area of the resonator.

39 Claims, 8 Drawing Sheets

OTHER PUBLICATIONS

"An Air–Gap Type Piezoelectric Composite Thin Film Resonator", Hiroaki Satoh et al., 1985, 15 Proc 39$^{th}$ Annual Symp. Freq. Control.

"Thin Film Bulk Acoustic Wave Filters for GPS", Lakin et al., 1992, Ultrasonic Symposium.

"Matrix Techniques for Modeling Ultrasonic Waves in Multilayered Media", Michael J.S. Lowe, 1995, IEEE Transactions on Ultrasonics, Ferroelectrics, and Frequency Control, vol. 42, No. 4.

English Translation of the Abstract of Japanese patent document No. JP 10093384.

English Translation of the Abstract of Japanese patent document No. JP 11135852.

English Translation of the Abstract of Japanese patent document No.: JP 6232688.

English Translation of the Abstract of Japanese patent document No.: JP 11191722.

* cited by examiner

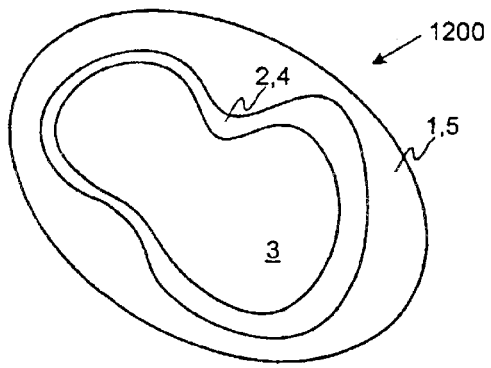
Fig. 12a
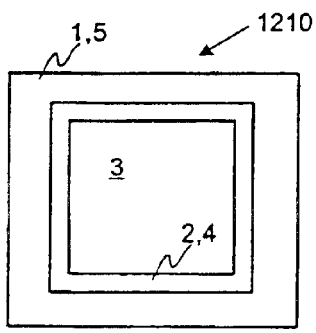 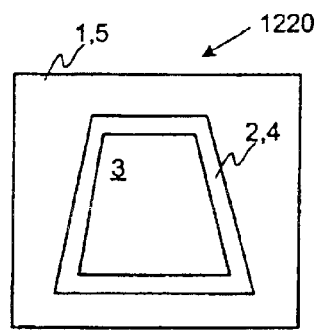 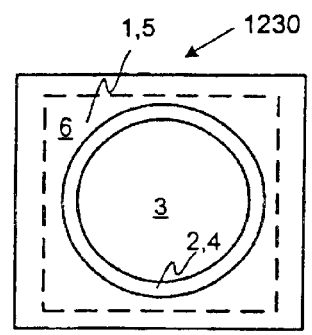
Fig. 12b    Fig. 12c    Fig. 12d
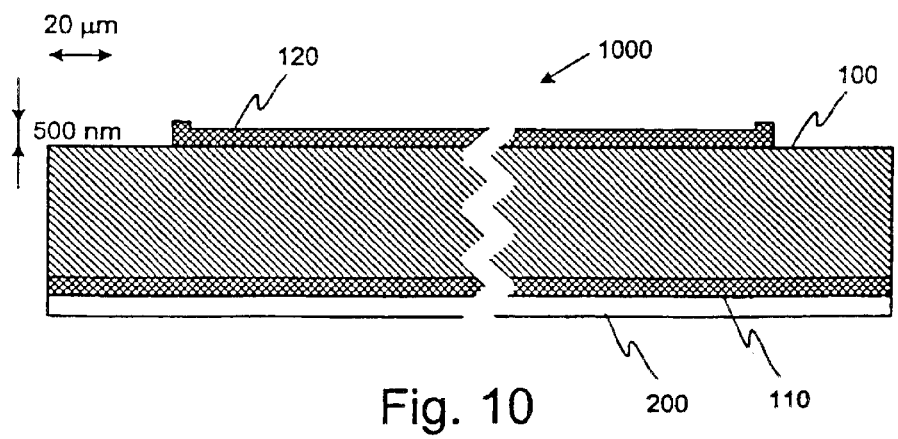
Fig. 10

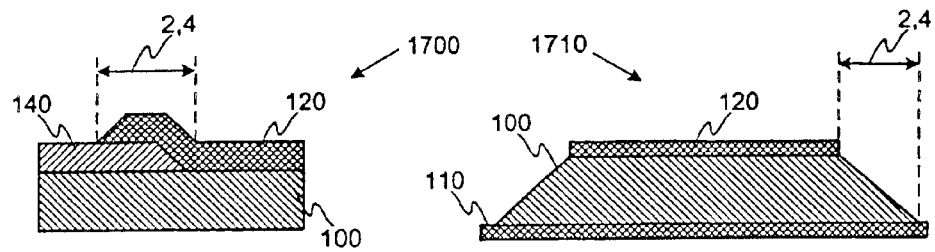
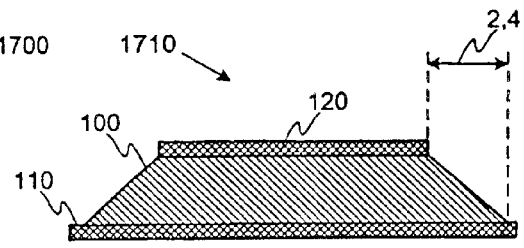
Fig. 17a          Fig. 17b
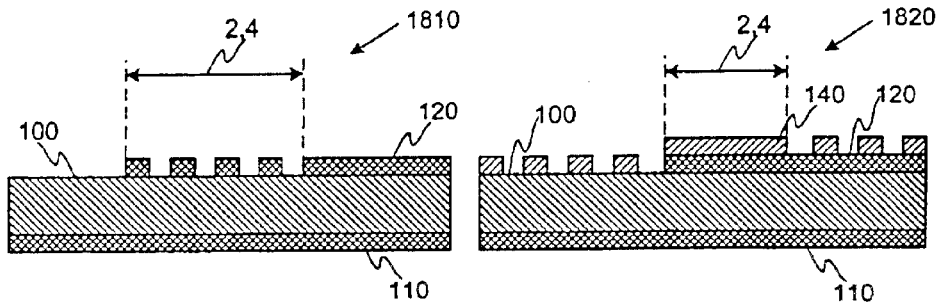
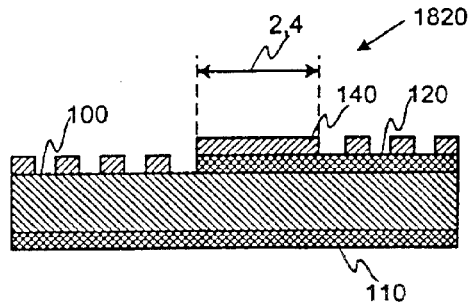
Fig. 18a          Fig. 18b
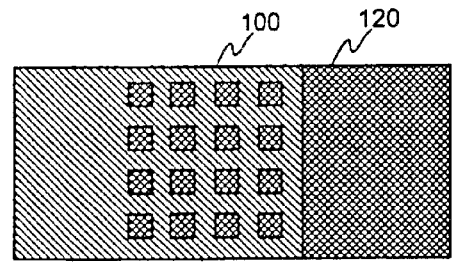
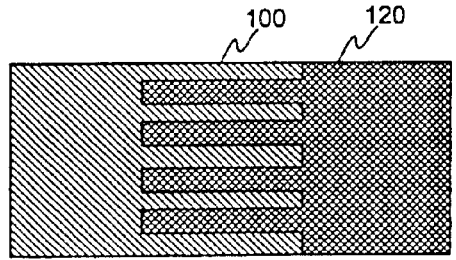
Fig. 18c          Fig. 18d

RESONATOR STRUCTURE AND A FILTER COMPRISING SUCH A RESONATOR STRUCTURE

This application claims the benefit of the earlier filed International Application No. PCT/FI00/00591, International Filing Date, Jun. 29, 2000, which designated the United States of America, and which international application was published under PCT Article 21(2) in English as WO Publication No. WO 01/06647 A1.

BACKGROUND OF THE INVENTION

The invention relates in general to piezoelectric resonators and to filters having piezoelectric resonators. In particular, the invention relates to a resonator structure, which is quite simple to manufacture and has good electrical properties.

The development of mobile telecommunications continues towards ever smaller and increasingly complicated handheld units. The development leads to increasing requirements on the miniaturization of the components and structures used in the mobile communication means. This development concerns radio frequency (RF) filter structures as well, which despite the increasing miniaturization should be able to withstand considerable power levels, have very steep passband edges, and low as losses.

The RF filters used in prior art mobile phones are often discrete surface acoustic wave (SAW) filters or ceramic filters. Bulk acoustic wave (BAW) resonators are not yet in widespread use, partly due to the reason that feasible ways of combining such resonators with other circuitry have not been presented. However, BAW resonators have some advantages as compared to SAW resonators. For example, BAW structures have a better tolerance of high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layers of zinc oxide (ZnO) sputtered over a thin membrane of silicon (Si). Further, in an article entitled "An Air-Gap Type Piezoelectric Composite Thin Film Resonator", 15 Proc. 39th Annual Symp. Freq. Control, pp. 361–366, 1985, by Hiroaki Satoh, Yasuo Ebata, Hitoshi Suzuki, and Choji Narahara, bulk acoustic wave resonator having a bridge structure is disclosed.

FIG. 1 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away some of the substrate from the top side. The gap serves as an acoustic isolator, essentially isolating the vibrating resonator structure from the substrate.

In the following, certain types of BAW resonators are described first.

Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputter vacuum evaporation or chemical vapor deposition BAW devices utilize a piezoelectric thin film layer for generating the acoustic bulk waves. The resonance frequencies of typical BAW devices range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:
an acoustically active piezoelectric layer,
electrodes on opposite sides of the piezoelectric layer, and
acoustical isolation from the substrate.

The piezoelectric layer may be for example, ZnO, AlN, ZnS or any other piezoelectric material that can be fabricated as a thin films as a further example, also ferroelectric ceramics can be used as the piezoelectric material. For example, $PbTiO_3$ and $Pb(Z_xTi_{1-x})O_3$ and other members of the so called lead lanthanum zirconate titanate family can be used.

The material used to form the electrode layers is an electrically conductive material. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta). The substrate is typically composed of for example Si, $SiO_2$, GaAs, glass, or ceramic materials.

The acoustical isolation can be produced with for example the following techniques:
with a substrate via-hole,
with a micromechanical bridge structure, or
with an acoustic mirror structure.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure. A bridge structure can also be produced using an etch pit structure, in which case a pit has to be etched in the substrate or the material layer below the BAW resonator in order to produce the free standing bridge structure.

FIG. 2 illustrates one example of various ways of producing a bridge structure. Before the deposition of other layers of the BAW structure, a sacrificial layer 135 is deposited and patterned first. The rest of the BAW structure is deposited and patterned partly on top of the sacrificial layer 135. After the rest of the BAW structure is completed, the sacrificial layer 135 is etched away. FIG. 3 shows also the substrate 200, a membrane layer 130, the bottom electrode 110, the piezoelectric layer 100, and the top electrode 120. The sacrificial layer can be realized using for example ceramic, metallic or polymeric material.

In the via-hole structure, the resonator is acoustically isolated from the substrate by etching away the substrate from under a major portion of the BAW resonator structure. FIG. 3 shows a via-hole structure of a BAW resonator. FIG. 4 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprises several layers having a thickness of one quarter wavelength at the center frequency, alternating layers having differing acoustical impedances. The number of layers in an acoustic mirror is typically ranging from three to nine. The ratio of acoustic impedance of two consecutive layers should be large in order to present as low acoustic impedance as possible to the BAW resonator, instead of the relatively high impedance of the substrate material. In the case of a piezoelectric layer that is one quarter of the wavelength thick, the mirror layers are chosen so that as high acoustic impedance as possible is presented to the resonator. This is disclosed in U.S. Pat. No. 5,373,268. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate. The polymer layer may be comprised of any polymer material having a low loss characteristic and a low acoustic impedance. Preferably, the polymer material is such that it can withstand temperatures of at least 350° C., since relatively high temperatures may be achieved during deposition of other layers of the acoustical mirror structure and other structures. The polymer layer may be comprised of, by example, polyimide, cyclotene, a carbon-based material, a silicon-based material or any other suitable material.

FIG. 4 shows an example of a BAW resonator on top of an acoustical mirror structure. FIG. 5 shows the substrate 200, the bottom electrode 110, the piezoelectric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be varied. For example, the material with a high acoustical impedance can be in the middle and the material with a low acoustical impedance on both sides of the middle material, or vice versa. The bottom electrode may also be used as one layer of the acoustical mirror.

FIG. 5 shows a further example of a BAW resonator structure. The BAW resonator illustrated in FIG. 5 is a stacked resonator structure having two piezoelectric layers 100. In addition to the bottom 110 and top 120 electrodes, a stacked structure requires a middle electrode 115, which is connected to ground potential. FIG. 6 further shows the membrane layer 130, the substrate 200 and the etch pit 210 isolating the structure from the substrate.

The cut-off frequency for a resonator is determined by assuming that the crystal resonator is infinite in the lateral direction. It is thus determined directly by the material of the layers in the resonator structure and by the thickness of the layers. The cut-off frequency is the mechanical resonance frequency of a laterally infinite plate.

The lateral dimensions of the resonator (or any plate) cause lateral resonance modes to emerge, and the basic resonance frequency of a resonator or that of a finite plate is somewhat higher or lower than its cut-off frequency. This fundamental later resonance mode or, in other words, the first mode lateral resonance corresponds to a situation, where there is an amplitude maximum in the middle of the resonator area.

In a finite plate there can be various mechanical vibrations, and any lateral resonance modes can be excited mechanical. Certain lateral resonance modes may be excited piezoelectrically, when an alternating voltage is exerted over the crystal. These lateral resonance modes that are usually at different frequencies cause the surface of the resonator to oscillate. The piezoelectrically excited strongest resonance mode is called the main mode and the other piezoelectrically excited modes are called spurious resonance modes. The spurious resonance modes usually occur at somewhat lower and/or higher frequencies than the cut-off frequency of a resonator.

One of the desired properties of a filter is that at the frequencies which the filter passes, the response of the filter is as even as possible. The variations in the frequency response are called the ripple. The frequency response of a filter should thus be constant, for example in a bandpass filter, over the bandwidth of the filter. In the blocking frequencies the ripple is usually not a problem.

The problem with the spurious resonance modes of crystal resonators and, for example, BAW resonators is that the ripple in filters that are constructed using these resonators is at least partly caused by spurious resonance modes of the resonators. This is discussed, for example, in an article entitled "Thin film bulk acoustic wave filters for GPS", in 1992 Ultrasonic Symposium, pp. 471–476, by K. M. Lakin, G. R. Kline and K. T. McCarron. The spurious resonance modes deteriorate the properties of systems that comprise crystal resonators or BAW resonators. The ripple in a frequency response of a filter is one example of the effect of the spurious resonances.

One of the goals of resonator design is to produce a resonator where the piezoelectrically excited strongest mode is a piston mode, where the amplitude distribution is flat across most of the resonator area. Usually, a resonator operating in the piston mode does not have strong spurious resonances. One of the main problems in resonator design is that, in general, the way how to make resonators operate in the piston mode is not known.

SUMMARY OF THE INVENTION

An object of the invention is to provide a resonator structure. A further object is to provide a resonator structure having good electrical response. A further object is to provide a resonator structure, where the displacement relating to the piezoelectrically excited strongest resonance mode is substantially uniform in an area covering a large part of the resonator; preferably the resonator structure operates in the piston mode. A further object of the invention is to provide a resonator structure that is easy to manufacture.

Objects of the invention are achieved by confining a center area of a resonator with a frame-like boundary zone, which has a different cut-off frequency than the center area, and by adjusting the properties of piezoelectrically excited resonance modes in the center area by selecting the acoustical properties and width of the frame-like boundary zone properly.

A resonator structure according to the invention is a resonator structure, where a certain wave mode is piezoelectrically excitable and which resonator structure comprises at least two conductor layers and at least one piezoelectric layer in between the conductor layers, said conductor layers and piezoelectric layer extending over a first area of the resonator structure, which first area is a piezoelectrically excitable area of the resonator structure, and which is characterized in that the resonator structure comprises a frame-like zone confining a center area, the center area is within the first area of the resonator structure, a cut-off frequency of the piezoelectrically excited wave mode in the layer structure of the frame-like zone is different from the cut-off frequency of the piezoelectrically excited wave mode in the layer structure of the center area, and width of the frame-like zone and acoustical properties of the layer structure in the frame-like zone are arranged so that displacement relating to the piezoelectrically excited strongest resonance mode is substantially uniform in the center area of the resonator.

An electrically excitable area of a resonator refers here to the area to which all the electrode layers and the piezoelectric layer(s) of the resonator extend. Usually the electrically excitable area is in the center of a resonator. In a resonator structure according to the invention, there is a frame-like zone that encircles a certain part of the electrically excitable area of the resonator. Term center area refers here to this part of the electrically excitable area, which is inside the frame-like zone. The center area does not have to be, for example, in the center of the resonator area.

The frame-like zone in a resonator according to the invention differs from the center area and from the area surrounding the frame-like zone in its acoustical properties. The cut-off frequency in the frame-like zone and/or the dispersion relation of the piezoelectrically excited wave mode in the frame-like zone may be different from those in the center area and/or in the area surrounding the frame-like zone. The cut-off frequency of a layer structure is determined by the thickness and acoustical properties of the layers, and by assuming that a plate having said layer structure is infinite. The dispersion relation depends on the material of the plates and on the acoustical wave mode (thickness extensional or shear), which is piezoelectrically excited in the resonator. The resonators according to the invention may operate in the thickness extensional mode or in the shear mode of fundamental (TE1, TS1) or higher order.

The acoustical properties and width of the frame-like zone in a resonator according to the invention are chosen so that when the resonator is excited piezoelectrically, the displacement of the strongest piezoelectrically excited wave mode is substantially uniform in the center area of the resonator. Consider a piezoelectrical plate having a certain thickness in vertical direction and electrodes on the horizontal surfaces. In the presence of a piezoelectrically excited thickness extensional wave the particles of the piezoelectrical material experience displacement in the vertical direction, in other words in the direction of the applied electrical field. In the presence of a piezoelectrically excited shear wave the particles of the piezoelectrical material experience displacement in the horizontal direction, in other words in a direction perpendicular to the applied electric field. When a resonance structure according to the invention is piezoelectrically excited, in the center area of the resonator there is a substantially uniform displacement. When the piezoelectrically excited wave is a thickness extensional wave, this means that the thickness of the center area varies as a function of time so that at each time instance the thickness of the center area, at substantially each point of the area, is the same. Similarly, when the piezoelectrically excited wave is a shear wave, the displacement of the particles is uniform in the horizontal direction. As an example of a uniform displacement, consider piston mode, where the displacement is uniform in a certain area of a resonator. In a resonator according to the invention, the uniform displacement related to the piston mode takes place in the center area of the resonator. Advantageously the center area operates in piston mode.

The active area of a resonator is the area where the acoustic wave has a considerable magnitude. It is possible that in a resonator according to the invention the center area covers most of the active area of the resonator, and consequently the electrical response of the resonator is dominated by the strongest piezoelectrically excited wave mode, advantageously by piston mode operation. The main advantage of the invention is thus that a resonator according to the invention exhibits good electrical response.

A suitable width and thickness for the frame-like zone can be estimated using a laterally one-dimensional model, as described below. It is also possible to find the optimum width and thickness for the frame-like zone experimentally.

The shape of the electrically excitable area of a resonator or the shape of the center area is not restricted to any particular shape in a resonator structure according to the invention. The center area in a resonator according to the invention may, for example, be rectangular, polygonal or circular. The width and acoustical properties of the frame-like zone are advantageously substantially uniform throughout the frame-like zone, but the resonator structures according to the invention are not restricted to such structures comprising a frame-like zone with uniform layer structure or with uniform thickness.

The center area of the resonator according to the invention is advantageously substantially uniform, in order to achieve piston mode operation. The thickness of the center area may vary slightly between the midpoint and the edges. In this case, piston mode operation is necessarily not achieved but the electrical response is still clean, in other words there are practically no spurious resonance modes.

The resonator structure according to the invention enhances the properties of conventional crystal resonators and especially the properties of thin-film BAW resonators. The properties of the prior-art BAW resonator types can be enhanced by modifying the structures according to the invention A resonator according to the invention may have, for example, a stacked structure.

In a resonator structure which has a frame-like zone whose width and thickness are selected properly, the strongest piezoelectrically excited mode in the center area of the resonator structure is piston mode. In such a structure, the spurious resonances occurring at frequencies near the piston operation frequency have often only a weak coupling, as discussed below in connection with a laterally one-dimensional model. This effect typically enhances the electrical properties of a resonator according to the invention even further.

When the properties of the resonators are enhanced, the properties of the components that comprise resonators are improved. Specifically, it is advantageous to manufacture filter using the resonator structures according to the invention. Such filters may be used, for example, in mobile communication devices.

Typically when a frame-like zone of a resonator is designed so that the strongest piezoelectrically excited mode in the center area of the resonator structure is piston mode, the resonator can be operated at a relatively wide frequency range around the piston mode operation point, because the anharmonic spurious modes are suppressed. A resonator can be designed to operate somewhat below or above the piston mode frequency to obtain an optimum overall response for a particular purpose. For example in a bandpass filter the ripple in the pass band may be minimized.

A further advantage of the invention is that the manufacture of resonators according to the invention does not necessarily require any additional manufacture steps. This is discussed in more detail in connection with the preferred embodiments of the invention.

The invention relates also to a filter comprising at least one resonator structure, where a certain wave mode is piezoelectrically excitable and which resonator structure comprises at least two conductor layers and at least one piezoelectric layer in between the conductor layers, said conductor layers and piezoelectric layer extending over a first area of the resonator structure, which first area is a piezoelectrically excitable area of the resonator structure, and which is characterized in that

- the resonator structure comprises a frame-like zone confining a center area,
- the center area is within the first area of the resonator structure,
- a cut-off frequency of the piezoelectrically excited wave mode in the layer structure of the frame-like zone is different from the cut-off frequency of the piezoelectrically excited wave mode in the layer structure of the center area, and
- width of the frame-like zone and acoustical properties of the layer structure in the frame-like zone are arranged so that displacement relating to the piezoelectrically excited strongest resonance mode is substantially uniform in the center area of the resonator.

BRIEF DESCRIPTION OF THE DRAWING

The invention will now be described more in detail with reference to the preferred embodiments by the way of example and to the accompanying drawings where FIG. 12 shows schematically top views of some resonators according to the invention, FIG. 17 illustrates schematically a resonator structure according to a fourth preferred embodiment of the invention, and FIG. 18 illustrates resonators structure according to a fifth preferred embodiment of the invention.

Above in conjunction with the description of the prior art reference was made to FIGS. 1–5. The same reference numerals are used for corresponding parts in the figures.

DETAILED DESCRIPTION OF THE INVENTION

Figure 6:
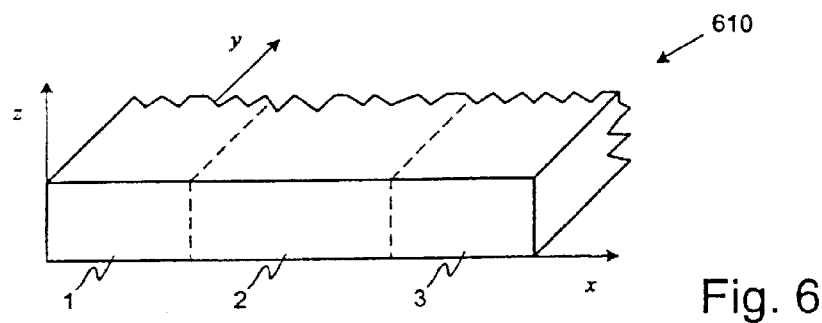
FIG. 6 illustrates the laterally one-dimensional model of a resonator.
Figure 7:
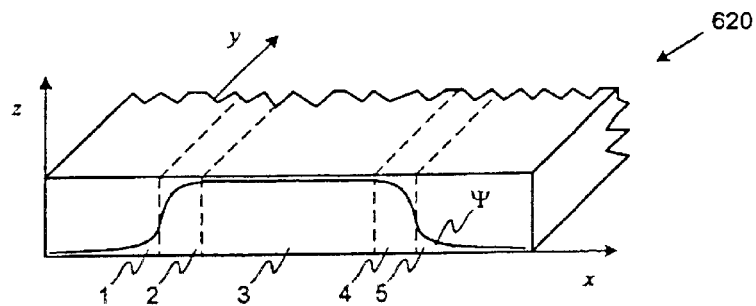

The effect of the frame-like zone on the piezoelectrically generated vibrations of the resonator can be, according to current view, most straightforwardly sketched using a laterally one-dimensional model of a resonator. In this model, the resonator is assumed to be a plate, whose length in, for example, the y-direction is infinite, and whose dimensions in the xz-plane are finite. FIG. 6 presents plates 610 and 620, whose length in y-direction is infinite. The lateral vibrations are, correspondingly, studied in one dimension, namely in the x-direction. If the material of the plate is elastically isotropic the equation for the displacement vector d of a sinusoidal acoustic wave is $$-\rho\omega^2 d = (\lambda+\mu)\nabla(\nabla \cdot d) + \mu\nabla^2 d \quad (1)$$

where $\rho$ is the density and $\lambda$ and $\mu$ are the elastic Lame's constants of the plate material.

The Helmholtz' theorem states that the solution can be expressed as $$d = \nabla\phi + \nabla \times A$$

where $\phi$ is a scalar function and A is a vector function. The equations for the longitudinal wave $\phi$ and for the shear wave A are $$-\omega^2 \rho \phi = (\lambda + 2\mu)\nabla^2 \phi$$

$$-\omega^2 \rho A = \mu \nabla^2 A.$$

The solutions for $\phi$ and A are $\phi = A_L e^{jk \cdot r}$ and $A = A_S e^{jk \cdot r}$, where $A_L$ and $A_S$ are amplitude constants, r is the position vector, k is the wave vector and j is the imaginary unit.

Thus there exist two types of waves with angular frequency $\omega$ as solutions to Equation 1. The displacement d is the sum of a displacement component $d_L$ related to the longitudinal wave and a displacement component $d_S$ related to the shear wave $$d = d_L + d_S = \nabla\phi + \nabla \times A = \nabla A_L e^{jk \cdot r} + \nabla \times A_S e^{jk \cdot r}. \quad (2)$$

For simplicity consider solutions that propagate in the lateral x-direction and in the vertical z-direction in the plate. Then the wave vector is $k = k_x u_x + k_z u_z$ where $u_x$ and $u_z$ are the unit vectors in the direction of the x-axis and z-axis. The displacement $d = d_x u_x + d_y u_y + d_z u_z$ on the surface z=0 of the plate becomes $$d(z=0) = \nabla A_L e^{jk_n x} + \nabla \times A_S e^{jk_n x} = C e^{jk_n x} \quad (3)$$

where C is a constant amplitude vector. This shows that the wave looks like a traveling harmonic wave on the surface.

The boundary conditions are zero stresses at the top and bottom surface of the plate, which can be expressed as $$j\omega \frac{\partial d_z}{\partial z} = 0.$$

The boundary conditions give a condition for the wave number $\sqrt{k_x^2 + k_z^2}$ and establish a dependence between the angular frequency $\omega$ and the wave number $k_x$ which is called the dispersion relation $k(\omega)$ of the wave. The wave number k may be real, which means a constant-amplitude propagating acoustic wave; it may be imaginary, which means an exponentially attenuating acoustic wave; or it may have a real part and an imaginary part indicating an exponentially attenuating sinusoidal acoustic wave. The cut-off angular frequency $\omega_C$, which corresponds to k=0, is determined by the thickness and acoustical properties of the layers of the plate.

In a multilayer structure four waves propagate in each layer. These are the shear and longitudinal waves propagating upwards and downwards. At an interface between two layers we must therefore consider eight types of waves: longitudinal and shear waves arriving from above the interface and leaving below the interface, and similarly longitudinal and shear waves arriving from below the interface and leaving above the interface. The boundary conditions at this interface pose some relations between these waves. One of them is that the component of the wave vector along the interface is the same for all waves. This is the plate wave number k used as the parameter in the dispersion relation. It gives the wavelength $2\pi/k$ and attenuation Im{k} of the wave propagating in the horizontal x-direction.

The dispersion relation $k(\omega)$ can be calculated for instance by the transfer matrix method of Thomson and Haskell [M. J. S. Lowe, Matrix techniques for modeling ultrasonic waves in multilayered media, IEEE Trans. Ultrason. Ferro. Freq. Control 42 4 (1995) 525–42]. In practice this must be accomplished numerically.

There are always several possible acoustic wave modes at different angular frequencies $\omega$ which can propagate in the plate. They are generally called plate modes and the most important of them are the Lamb waves. In resonators the interesting plate modes are the bound or non-leaking modes which are localized in a finite part of the plate. Other modes will escape from the resonator and they are therefore not observable. The bound modes have decreasing amplitude when the x coordinate approaches negative or positive infinity.

In a general case the vibration in a plate must be described by two harmonic waves traveling in opposite lateral directions. The displacement of this Lamb wave is approximated by a scalar function $\Psi(x)$ $$\Psi(x) = Ae^{-jkx} + Be^{+jkx}. \tag{4}$$

When the plate consists of different adjacent regions i in the x-direction, the constants A and B and the wave number k are different in every region i in the plate. The equation above thus reads.

$$\Psi_i(x_i) = A_i e^{-jk_i x_i} + B_i e^{+jk_i x_i}$$

For simplicity of notation we choose the coefficients $A_i$ and $B_i$ in such a way that in each region i the coordinate $x_i=0$ at the left boundary and $x_i=W_i$ at the right boundary. In FIG. 6, for example, the plate 610 consists of thee regions, where i=1, 2 and 3.

The amplitude of the particle displacement d can be written as $d=\Psi d_0$, where $d_0$ defines the vibration mode of the wave and function $\Psi$ tells the amplitude and phase of the amplitude of displacement as functions of x. The stress vector is approximately written $$F = cm\frac{d\Psi}{dx}$$

where c is the stiffness matrix of the material and m is a constant vector determined by the vibration mode. Here we assume that the elastic stiffness is the same in all the regions i because we mainly consider structures where the layers are almost continuous in the x direction.

At each interface between the different regions the displacement d must be continuous and the stress F must be equal on both sides of the interface. When the stiffness c is assumed constant these conditions require that the displacement function $\Psi$ and its differential $d\Psi/dx$ must be continuous $$\Psi_i(x_i = W_i) = \Psi_{i+1}(x_{i+1} = 0) \tag{5}$$

$$\left.\frac{d\Psi_i}{dx}\right|_{x_i=W_i} = \left.\frac{d\Psi_{i+1}}{dx}\right|_{x_{i+1}=0}.$$

This gives conditions for the coefficients $A_i$ and $B_i$ in the different regions i. In the interface between regions p and q, where $x_p=W_p$ and $x_q=0$, we get $$A_q + B_q = A_p e^{-jk_p w_p} + B_p e^{jk_p w_p}$$

$$-A_q k_q + B_q k_q = -A_p k_p e^{-jk_p w_p} + B_p k_p e^{jk_p w_p} \tag{6}$$

where $W_p$ is the width of the region p. Now we can compute the coefficients $A_i$ and $B_i$ (and thus the amplitude $\Psi$) at any point in the structure, if we know them at one point.

Let the regions of the plate in the xz-plane be numbered from left to right and the numbering starts from i=1, as presented in FIG. 6. In the leftmost region 1 the wave number $k_1$ is imaginary and the coefficient $B_1=0$, otherwise the amplitude of the wave would grow when $x \to -\infty$. Between the regions 1 and 2, Equations 6 become $$A_2 + B_2 = \Psi_0$$

$$-A_2 k_2 + B_2 k_2 = -k_1 \Psi_0 \tag{7}$$

where $\Psi_0$ is the displacement at the interface between regions 1 and 2. We can solve the amplitude coefficients in region 2

$$A_2 = \frac{k_2 + k_1}{2k_2}\Psi_0 \tag{8}$$

$$B_2 = \frac{k_2 - k_1}{2k_2}\Psi_0$$

The strength of the resonance modes is determined by their piezoelectric coupling. The piezoelectrically generated voltage V is proportional to the displacement $\Psi$ of the vibration. In the laterally one-dimensional model we calculate the voltage as an integral over the electroded region $W_{ele}$.

$$V = h \int_{x=0}^{W_{ele}} \Psi dx \tag{9}$$

where h is a proportionality constant. If the electroded region contains only one region whose width is $W_{ele}$, integration of the displacement (Equation 4) gives the voltage $$V = \frac{h}{jk_{ele}}[-A_{ele}(e^{-jk_{ele}W_{ele}} - 1) + B_{ele}(e^{jk_{ele}W_{ele}} - 1)], \text{ if } k_{ele} \neq 0 \quad (10)$$

$$V = hW_{ele}(A_{ele} + B_{ele}), \text{ if } k_{ele} = 0.$$

The amplitude coefficients $A_i$ and $B_i$ are determined by the boundary conditions. We first consider a classical crystal oscillator 610, whose structure is symmetrical so that the leftmost region 1 and the rightmost region 3 are identical, and the vibration is trapped in the center region 2.

The displacement $\Psi$ and its differential $\nabla\Psi$ (or, in this model, $d\Psi/dx$) in the three regions are

| Region | 1 | 2 | 3 |
|---|---|---|---|
| $\Psi$ | $A_1 e^{K_1 x_1}$ | $A_2 e^{-jk_2 x_2} - B_2 e^{jk_2 x_2}$ | $B_3 e^{-K_3 x_3}$ |
| $\frac{d\Psi}{dx}$ | $K_1 A_1 e^{K_1 x_1}$ | $-jk_2 A_2 e^{-jk_2 x_2} + jk_2 B_2 e^{jk_2 x_2}$ | $-K_3 B_3 e^{-K_3 x_3}$ |
| $\Psi(0)$ | 0 | $A_2 + B_2$ | $B_3$ |
| $\Psi(W)$ | $\Psi_0$ | $A_2 e^{-jk_2 W_2} + B_2 e^{jk_2 W_2}$ | 0 |
| $\frac{d\Psi}{dx}\bigg|_{x=0}$ | 0 | $jk_2(B_2 - A_2)$ | $-K_3 B_3$ |
| $\frac{d\Psi}{dx}\bigg|_{x=W}$ | $K_1 \Psi_0$ | $jk_2(-A_2 e^{-jk_2 W_2} + B_2 e^{jk_2 W_2})$ | 0 | where $\Psi_0$ is the displacement at the interface between regions 1 and 2. The wave numbers $k_1$ and $k_3$ are purely imaginary, because the amplitude of the wave decreases towards positive and negative infinity. In the above they have been marked using real numbers $K_1 = -jk_1$ and $K_3 = -jk_3$.

The conditions for a resonance of standing waves are that the displacement $\Psi$ and its differential $\nabla\Psi$ are continuous at the border of regions 1 and 2 and at the border of regions 2 and 3. The continuity of the displacement results in $$A_2 + B_2 = \Psi_0$$

$$A_2 e^{-jk_2 w_2} + B_2 e^{jk_2 w_2} = B_3$$

and the continuity of its differential results in $$jk_2(B_2 - A_2) = K_1 \Psi_0$$

$$jk_2(-A_2 e^{-jk_2 w_2} + B_2 e^{jk_2 w_2}) = -K_3 B_3.$$

From these the following condition for the resonance of the lateral waves can be derived $$e^{jk_2 W_2} = s\frac{A_2}{B_2}$$

where $s=+1$ for symmetric solutions $\Psi$ and $s=-1$ for antisymmetric solutions $\Psi$. The real and imaginary parts of this equation must fulfill $$\cos k_2 W_2 + \frac{K_1}{k_2} \sin k_2 W_2 = s$$

$$\sin k_2 W_2 - \frac{K_1}{k_2} \cos k_2 W_2 = s\frac{K_1}{k_2}$$

and the resonance thus occurs when $$\sin k_2 W_2 = s\frac{2K_1/k_2}{1 + \left(\frac{K_1}{k_2}\right)^2}$$

The piezoelectrically generated voltage for the resonance is $$V = \frac{h}{jk_2}(s+1)(A_2 - B_2) = \frac{hK_1 \Psi_0}{k_2^2}(s+1)$$

where the $A_2$ and $B_2$ have been expressed using $K_1$ and $k_2$. For antisymmetric solutions the piezoelectrically generated voltage vanishes, so there is no piezoelectric coupling. All symmetric solutions are piezoelectrically generated because $A_2 - B_2$ is never equal to zero in the region 2 in resonator 610.

Next, consider a symmetric resonator 620 with five regions. The region 3 is in the center of the structure. The regions 2 and 4 are identical and they are adjacent to region 3. The leftmost region 1 and the rightmost region 5 are also identical, and region 1 is adjacent to region 2 and region 5 is adjacent to region 4. From now on in this description, the regions numbered with 1, 2, 3, 4 and 5 refer to a symmetric resonator having (at least) these five regions in this order. In a resonator 620, the displacement $\Psi$, in regions 2, 3 and 4 is $$\Psi_1 = A_1 e^{-jk_1 x_1} + B_1 e^{+jk_1 x_1},$$

in regions 1 and 5 it is $\Psi_1 = A_1 e^{K_1 x_1}$ and $\Psi_5 = B_5 e^{-K_5 x_5}$, where $K_1$ and $K_5$ are real numbers.

The resonance condition for the region 3 can be expressed $$\Psi_3(0) = s\Psi_3(W_3)$$

$$\frac{d\Psi_3}{dx}\bigg|_{x_3=0} = -s\frac{d\Psi}{dx}\bigg|_{x_3=W_3}$$

where again the symmetry of the solution $\Psi$ is expressed by $s=\pm 1$. This gives the following condition for the resonance of the lateral waves $$e^{jk_3 W_3} = s\frac{A_3}{B_3}.$$

The piezoelectrically generated voltage becomes $$V = \frac{h}{jk_3}(s+1)(A_3 - B_3), k_3 \neq 0$$

$$V = hW_3(A_3 + B_3), k_3 = 0.$$

The antisymmetric solutions ($s=-1$) are not piezoelectrically generated. The strength of the symmetric solutions is determined by the difference $A_3 - B_3$, which can be small or vanish altogether. The strength of the symmetric resonance modes can be computed numerically.

The strength of the lateral resonance mode with wave number $k_3 = 0$ depends on the sum $A_3 + B_3$. This lateral resonance mode is the piston mode whose amplitude distribution is flat and, consequently, the derivative of $\Psi$ is zero, i.e. $\nabla\Psi = 0$, in the center region 3. For the derivative of $\Psi$ to be continuous, at the boundary between the regions 2 and 3 the following must be true $$\frac{d\Psi_2}{dx}\bigg|_{x_2=W_2} = jk_2(-A_2 e^{-jk_2 W_2} + B_2 e^{jk_2 W_2}) = 0.$$

It is thus possible to determine the width $W_2$ of the region 2 which results in the piston mode operation in the region 3. From the equation above we get $$e^{jk_2 W_2} = \frac{A_2}{B_2} = \frac{k_2 + jK_1}{k_2 - jK_1}.$$

Equating the real and imaginary parts gives $$\sin 2k_2 W_2 = \frac{2K_1 k_2}{K_1^2 + k_2^2},$$

which is the same as $\tan k_2 W_2 = K_1/k_2$. The width $W_2$ which results in the piston mode satisfies thus the following equation $$W_2 = \frac{\arctan\frac{K_1}{k_2} + n\pi}{k_2}, n = 0, 1, 2, K \quad (11)$$

As discussed above, the number $K_1$ is real (the wave number $k_1 = jK_1$ has imaginary value). For the width $W_2$ to be positive, the wave number $k_2$ needs to have a real value. The displacement $\Psi$ in the center region 3 is $$\Psi_3 = A_3 + B_3 = \frac{k_2 + jK_1}{k_2} e^{jk_2 W_2} \Psi_0 = \frac{\sqrt{k_2^2 - K_1^2}}{k_2} \Psi_0,$$

which is a constant function.

At the piston mode frequency the gradient of the amplitude $d\Psi_2/dx = 0$ at $W_2$.

Because it must be equal to $$\frac{d\Psi_3}{dx}\bigg|_{x_3=0} = -jk_3 A_3 + jk_3 B_3$$

we see immediately that $A_3 = B_3$. At frequencies close to the piston mode the gradient $d\Psi_2/dx$ usually remains small which means that $A_3$ is close to $B_3$ and the piezoelectric coupling which is proportional to $A_3 - B_3$ is weak. Therefore these spurious modes tend to be weak.

The same theory that has been applied in analysing resonators operating in the thickness extensional wave modes can be applied to resonator operating in the shear modes, too.

As discussed above, in the theoretical case of a resonator, whose dimension in one direction is infinite, it is possible to choose the width of the regions (e.g. regions 2 and 4 in resonator 620) which confine the center region (e.g. region 3 in resonator 620) so that the center region operates in piston mode. Real resonators have finite dimensions, and therefore the lateral waves and the lateral resonances occur at a two-dimensional plane. The result obtained using the laterally one-dimensional model can be generalized to this case, where a frame-like zone (corresponding to regions 2 and 4 above) confines a center area corresponding to the center region 3 above. The optimal width of the frame-like zone is not necessarily the same as above discussed for the regions 2 and 4, but it can be found, for example, experimentally. Although the laterally one-dimensional model discusses extensional wave modes, resonators operating in shear mode can be analyzed similarly. The material properties and cut-off frequency related to extensional wave modes are usually different from those related to shear modes, so proper thickness and width of a frame-like zone are typically different for shear and extensional wave modes.

In a real resonator structure having a frame-like zone, whose width and thickness are selected properly, the strongest piezoelectrically excited mode in the center area of the resonator structure is piston mode. In such a structure, the spurious resonances occurring at frequencies near the piston operation frequency have often only a weak coupling. This effect enhances the electrical properties of a resonator according to the invention even further. In a real resonator the spurious resonances are seldom purely symmetric or antisymmetric, so that the results concerning the antisymmetric or symmetric solutions (resonance modes) usually cannot be directly applied in real resonator structures.

Figure 7:
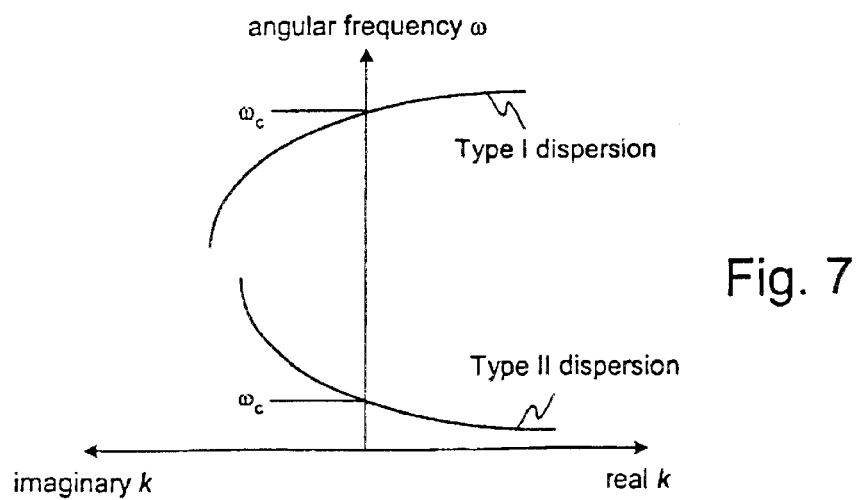
FIG. 7 illustrates schematically typical dispersion relations $k(\omega)$.

A resonator according to the invention comprises at least two regions: the center area, which is in the piezoelectrically excitable area of the resonator, and a frame-like zone, which confines the center area. The center area corresponds to the region 3 of the laterally one-dimensional model described above, and the frame-like zone corresponds to the regions 2 and 4 of the laterally one-dimensional lateral model. A suitable thickness of the frame-like zone depends on the dispersion relation $k(\omega)$ in the frame-like zone and in the material which surrounds the frame-like zone. The dispersion relation $k(\omega)$ may have one of the two general forms depicted in FIG. 7, where the angular frequency $\omega$ is schematically presented as a function of the wave number k. The horizontal axis on the right side of the vertical axis represents real values of the wave number k and on the left side of the vertical axis the wave number is imaginary. The vertical axis in FIG. 7 represents the angular frequency $\omega$. In type I dispersion the wave number k is real, when the angular frequency $\omega$ is above the cut-off angular frequency $\omega_c$ of the plate. In type II dispersion the wave number k is real, when the angular frequency $\omega$ is below the cut-off angular frequency $\omega_c$. For example, in a homogeneous plate the dispersion of TE1 (first thickness extensional) mode is of the type I when the Poisson's ratio of the material is above ⅓ and of the type II when the ratio is below ⅓.

As discussed above in connection with the lateral one-dimensional model of a resonator, the center area of a resonator according to the invention may operate in the piston mode under piezoelectric excitation, when at the operation frequency the wave number is real in the frame-like zone, zero in the center region and imaginary in the material surrounding the frame-like. To obtain a real wave number in a certain plate or in a certain part of a plate, the cut-off frequency has to be lower than the operating frequency, when the dispersion $k(\omega)$ is of type I. If the dispersion is of type I, then the cut-off frequency has to be higher than the operating frequency for the wave number to be real at the operating frequency. The operating frequency of piston mode is the same as the cut-off frequency of the center area of a resonator.

The rule for choosing the angular cut-off frequencies $\omega_{C1}$ in the surrounding area and $\omega_{C2}$ in the frame-like zone is that the wave number in the surrounding area is imaginary and in the frame-like zone real at the piston mode frequency, which is the cut-off frequency $\omega_{C3}$ in the center region. Table 1 summarizes suitable choices for the angular cut-off frequencies $\omega_C$ at the frame-like zone (region 2) and at the material surrounding the frame-like zone (region 1). The cut-off frequency can be adjusted, for example, by adjusting the thickness of the layers at these regions. The angular frequency $\omega_{C3}$ denotes to the angular cut-off frequency of the center area of a resonator (region 3).

TABLE 1

The design rules for achieving piston mode operation.

| Region of resonator structure | Dispersion type | Design rule |
|---|---|---|
| Region 1 | I | $\omega_{C1} > \omega_{C3}$ |
| Region 1 | II | $\omega_{C1} < \omega_{C3}$ |
| Region 2 | I | $\omega_{C2} < \omega_{C3}$ |
| Region 2 | II | $\omega_{C2} > \omega_{C3}$ |

Figures 8A, 8B, 8C:
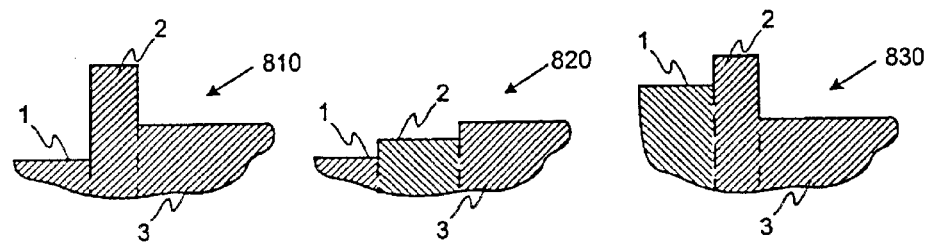
FIG. 8 illustrates schematically partial cross sections of various resonator structures according to the invention.
Figures 8D, 8E, 8F:
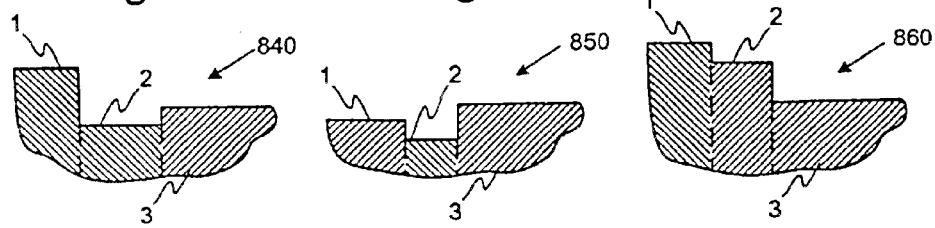

Table 2 shows six examples of laterally one-dimensional resonator structures according to the invention. The six examples present possible combinations of the two dispersion types I and II in the regions 1 and 2. The angular cut-off frequency of the center area of the resonator is $\omega_{C3}=6 \cdot 10^9$ 1/s and the angular cut-off frequencies of the regions 1 and 2 are selected according to Table 1. The wave numbers $k_1$ and $k_2$ are calculated using a dispersion relation $$k=\sqrt{\alpha(\omega^2-\omega_C^2)},$$

where $\alpha$ is a parameter that determines the dispersion type. The thickness $W_2$ is calculated using Equation 11. Table 2 presents two possible widths for the boundary region 2 in the two last rows. The variable n in Equation 11 affects the width of the boundary region, and if, for example, due to resolution in the manufacturing process, it is not possible to manufacture a frame-like zone, whose width corresponds to n=0 case, then it is possible to use n=1.

relation of the cut-off frequencies in resonator 810 is the following: $\omega_{C2}<\omega_{C3}<\omega_{C1}$. To achieve this relation, usually the frame-like zone of a resonator according to the invention is thicker than the center area, and the region surrounding the frame-like zone is thinner than the frame-like zone. FIG. 8*b* shows a resonator 820, where the dispersion in region 1 is of type I and in region 2 the dispersion is of type II. The relation of the cut-off frequencies in resonator 820 is the following: $\omega_{C3}<\omega_{C2}<\omega_{C1}$. In this case, usually both the frame-like zone and the region surrounding the frame-like zone are thinner than the center area of a resonator. FIG. 8*c* presents a resonator 830, where the dispersion in region 1 is of type II and in region 2 it is of type I, and the relation of the cut-off frequencies is $\omega_{C2}<\omega_{C1}<\omega_{C3}$. In FIG. 8*d*, the dispersion is of type II in both the regions 1 and 2 of resonator 840, and the relation of the cut-off frequencies is $\omega_{C1}<\omega_{C3}<\omega_{C2}$. FIG. 8*e* shows a partial cross section of a resonator 850, where the dispersion is of type II in region 2 and of type I in region 1 and the relation of the cut-off frequencies is $\omega_{C3}<\omega_{C1}<\omega_{C2}$. FIG. 8*f* shows a partial cross section of a resonator 860, where the dispersion is of type I both in region 1 and 2. The relation of the cut-off frequencies is $\omega_{C1}<\omega_{C2}<\omega_{C3}$ in resonator 860.

Figure 9:
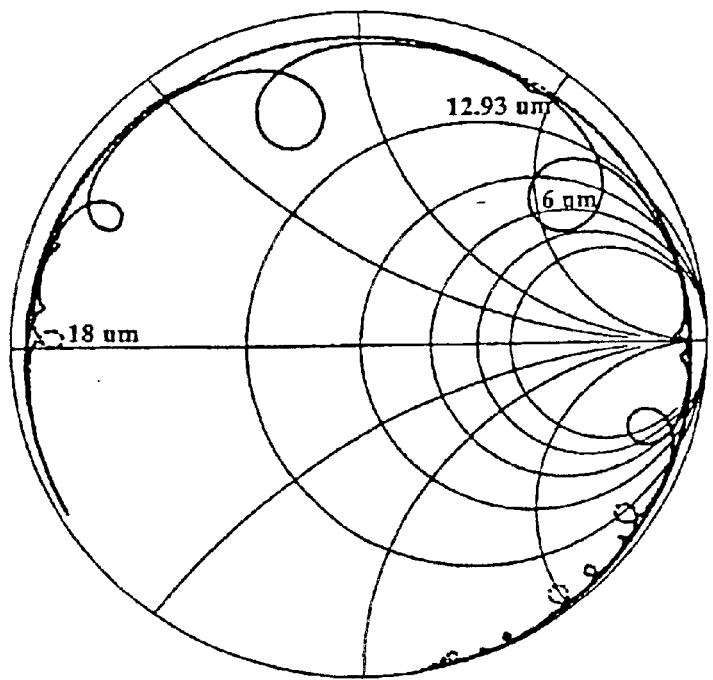
FIG. 9 shows on Smith's chart a calculated electrical response of various resonator structures similar to that presented in FIG. 8a, FIG. 10 shows schematically a bulk acoustic wave resonator structure according to a first preferred embodiment of the invention.

The calculated electrical responses of three laterally one-dimensional resonators having the structure specified in FIG. 8*a* is presented in FIG. 9. The three resonators have the same angular cut-off frequencies of the regions 1, 2 and 3: $\omega_{C1}=6.4 \cdot 10^9$, $\omega_{C2}=5.93 \cdot 10^9$ and $\omega_{C3}=6.0 \cdot 10^9$ 1/s. The width $W_2$ of the boundary region 2 varies from resonator to resonator, and the three widths $W_2$ are 6 μm, 12.93 μm and 18 μm.

The electrical responses are presented in FIG. 9 on Smith's chart. Smith's chart is a way to present the impedance of a certain electrical component as a function of the

TABLE 2

Some resonator structures that produce piston mode operation.

| | Partial cross-section in Figure | | | | | | |
|---|---|---|---|---|---|---|---|
| | 8a | 8b | 8c | 8d | 8e | 8f | |
| Dispersion in region 1 | I | I | II | II | I | II | |
| Dispersion in region 2 | I | II | I | II | II | I | |
| Dispersion in region 3 | I | I | I | I | I | I | |
| α in region 1 | $10^{-8}$ | $10^{-8}$ | $-10^{-8}$ | $-10^{-8}$ | $10^{-8}$ | $-10^{-8}$ | $s^2/m^2\, rad^2$ |
| α in region 2 | $10^{-8}$ | $-10^{-8}$ | $10^{-8}$ | $-10^{-8}$ | $-10^{-8}$ | $10^{-8}$ | $s^2/m^2\, rad^2$ |
| α in region 3 | $10^{-8}$ | $10^{-8}$ | $10^{-8}$ | $10^{-8}$ | $10^{-8}$ | $10^{-8}$ | $s^2/m^2\, rad^2$ |
| $\omega_{c,1}$ | 6.05 | 6.05 | 5.95 | 5.95 | 6.03 | 5.93 | $10^9$ rad/s |
| $\omega_{c,2}$ | 5.93 | 6.03 | 5.93 | 6.03 | 6.05 | 5.95 | $10^9$ rad/s |
| $\omega_{c,3}$ | 6.00 | 6.00 | 6.00 | 6.00 | 6.00 | 6.00 | $10^9$ rad/s |
| $k_1$ | j77621 | j77621 | j77298 | j77298 | j60075 | j91384 | 1/m |
| $k_2$ | 91384 | 60075 | 91384 | 60075 | 77621 | 77298 | 1/m |
| $k_3$ | 0 | 0 | 0 | 0 | 0 | 0 | 1/m |
| $W_2$ (n = 0) | 7.7 | 15.2 | 7.7 | 15.2 | 8.5 | 11.2 | μm |
| $W_2$ (n = 1) | 42.1 | 67.5 | 42.1 | 67.4 | 49.0 | 51.9 | μm |

FIGS. 8*a*–8*f* present schematically partial cross-sections of the resonator structures specified in Table 2. The various cut-off frequencies of Table 2 are presented in FIG. 8 as a varying thickness of a resonator structure: usually the higher cut-off frequency means a thinner plate, and this is the logic in FIG. 8. Please note, however, that in addition to the thickness of the layers, the material of the layers forming a plate also affects the cut-off frequency of the plate. FIG. 8*a* presents a partial cross section of a resonator 810, where both in region 1 and region 2 the dispersion is of type I. The frequency. In Smith's chart, frequency increases in a clockwise manner. A resonator which resonates only in the basic resonance mode produces a circle on Smith's chart. Possible loops in the diagram indicate spurious resonance frequencies. The size of the loops indicates the strength of the spurious resonances.

The width $W_2=12.93$ μm is calculated using Equation 11. The electrical response of a resonator having $W_2=12.93$ μm is presented in FIG. 9 with a thin solid line. This line forms almost a circle in FIG. 9, indicating that this resonator operates in the piston mode. The electrical response of a resonator having width $W_2=6$ μm is presented in FIG. 9 with a thick solid line. It has several circles on the Smith's chart. This indicates that the resonator, where $W_2=6$ μm, has spurious resonances at various frequencies. The electrical response of a resonator having width $W_2=18$ μm is presented in FIG. 9 with a dashed line and it has several circles that are smaller and at different frequencies than those of the $W_2=6$ μm resonator. The resonator having $W_2=18$ μm produces better electrical response than the resonator where $W_2=6$ μm, but the width $W_2=12.93$ μm produces the cleanest electrical response without any spurious resonances.

Table 3 presents a further example of a laterally one-dimensional resonator according to the invention. This resonator has a typical layer structure of a BAW resonator. It comprises a top electrode made of aluminium and a bottom electrode made of molybdenum. In between these electrodes, there is a piezoelectric layer of ZnO. The resonator structure is on a support layer made of $SiO_2$. Table 3 specifies the widths of regions 1–5 and the thickness of each layer at the regions. In the BAW resonator described in Table 3 the frame-like zone is formed by making the top electrode thicker near its edges.

The thickness and width of the frame-like zone (boundary region 2;4) in a resonator according to the invention may be estimated based on the following design rule. Consider an infinitely long slab, which has a width $2W_2$, whose the layer structure is that of the boundary region 2;4 and which is surrounded by both sides by the layer stack of region 1;5. The width $2W_2$ is chosen so that the lowest lateral resonance frequency in the slab is equal to the cut-off frequency of the center area of the resonator. The width of the actual boundary region 2;4 in the complete resonator is then half of the width of the slab, in other words it is $W_2$. The frequency of the lowest lateral resonance mode of a infinitely long slab, whose width is $2W_2$, whose layer structure is known and where also the layer structure adjacent to the slab is known, can be determined straightforwardly, for example, using finite element method (FEM). Similarly, the cut-off frequency of a layer structure can be determined, when the materials and the thicknesses of the layers are known. This design rule produces practically the same width for the fame-like zone as the laterally one-dimensional model described above. When calculating $W_2$ in Table 3, material parameter values of Al, Mo, $SiO_2$ and ZnO found in the literature are used.

FIG. 10 presents schematically the BAW resonator structure 1000 specified in Table 3. The $SiO_2$ support layer 200 corresponds to a substrate. The bottom electrode 110 and the ZnO piezoelectric layer 100 extend over the whole resonator width. The top electrode 120 covers the boundary regions 2 and 4, and the center region 3. The boundary regions 2 and 4 of the resonator structure 1000 are formed by making the top electrode 120 thicker at the edge of the electrically excitable area. The arrows in FIG. 10 indicate the scale; please note that the scale is different in the horizontal and vertical directions.

TABLE 3

Structure of an example BAW resonator according to the invention.

| Region | 1 | 2 | 3 | 4 | 5 |
|---|---|---|---|---|---|
| Top electrode Al (nm) | 0 | 500 | 400 | 500 | 0 |
| Piezoelectric layer ZnO (nm) | 2200 | 2200 | 2200 | 2200 | 2200 |
| Bottom electrode Mo (nm) | 400 | 400 | 400 | 400 | 400 |
| Support layer $SiO_2$ (nm) | 500 | 500 | 500 | 500 | 500 |
| Width of region (μm) | 40 | 4.29 | 250 | 4.29 | 40 |
| Cut-off freq.$f_c$ (MHz) | 1059.94 | 973.48 | 990.90 | 973.48 | 1059.94 |
| Electrodes | No | Yes | Yes | Yes | No |
| Q value | 1000 | 1000 | 1000 | 1000 | 1000 |

Figure 11:
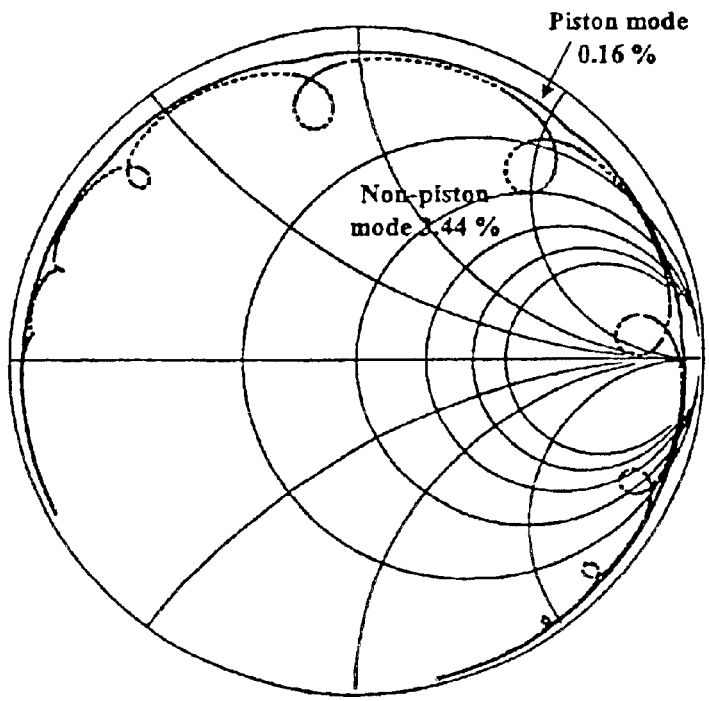
FIG. 11 shows on Smith's chart a calculated electrical response of the resonator structure presented in FIG. 10.

FIG. 11 presents on Smith's chart the calculated electrical response of two resonator structures. The other is a resonator structure 1000 specified in Table 3 and presented in FIG. 10. It is thus a resonator according to the invention, and its electrical response is illustrated with a solid line in FIG. 11. The dashed line in FIG. 11 presents the electrical response of a resonator structure which does not comprise a boundary region according to the invention. This flat resonator is otherwise similar to that specified in Table 3, but the thickness of the top electrode at the regions 2 and 4 is 400 nm. In other words, the top electrode has uniform thickness.

It is possible to describe the electrical response of a resonator by calculating how much the electrical response deviates from a circle on the Smith's chart. The solid line in FIG. 11 forms almost a circle with standard deviation only 0.16%. A resonator 1000 according to the invention thus operates very purely in the piston mode. The dashed line in FIG. 11 forms clear loops, and the standard deviation from the circle is 3.44%. The electrical response of the flat resonator is distinctly worse than that of the resonator 1000 according to the invention.

As can be noted, in a laterally one-dimensional resonator according to the invention the center region can be obtained to operate in piston mode, and this does not depend on the width of the center region. Similarly, the center area 3 of a real resonator having finite lateral dimensions does not have to have any specific form. The center area in a resonator according to the invention is thus not restricted to any specific forms, and it may have, for example, the free-shaped form illustrated in FIG. 12a. The center area 3 may, for example, be rectangular as in resonator 1210 in FIG. 12b, polygonal as in resonator 1220 in FIG. 12c or circular as in resonator 1230 in FIG. 12d. The shape of the electrically excitable area can be different from the shape of the center area, as long as the center area is within the electrically excitable area. The frame-like zone may be on the electrically excitable area, it may be partially on the electrically excitable area or it may encircle the electrically excitable. In the last case, the electrically excitable area is the same as the center area. Typically it is advantageous to restrict the electrically excitable area to the area confined by the outer circle of the frame-like zone.

The laterally one-dimensional model above discusses only regions with constant thickness. It is also possible to construct resonators where the thickness varies within the regions. The optimal width for the frame-like zone can in this case be found, for example, experimentally or using numerical simulations. It is also possible that the frame-like zone of a real resonator is not uniform. If, for example, the material surrounding the frame-like zone is not uniform around the frame-like zone, the thickness and the width of the frame-like zone can vary accordingly so that the boundary condition $\nabla\Psi=0$ is substantially satisfied at the edge of the center area. This boundary condition is equivalent to saying that the displacement relating to the piezoelectrically excited strongest resonance mode is substantially uniform in the center area of the resonator.

The width of the frame-like zone in real three-dimensional resonators can be estimated, for example, using the design rule presented above. The exact optimum dimensions for the frame-like zone are often found experimentally because, for example, of the uncertainties in the material parameters in thin films.

Let us next consider some examples of constructing a frame-like zone to a resonator structure. In a first preferred embodiment of the invention, the frame-like zone is constructed by making at least one of the layer thicker around the center area. The BAW resonator 1000 presented in FIG. 10 is an example of a resonator according to a first preferred embodiment of the invention; there the frame-like zone is formed by the thickness variation of the top electrode 120. If the frame-like zone is formed by thickening the top electrode, then frame-like zone is typically within the electrically excitable area.

Figure 13:
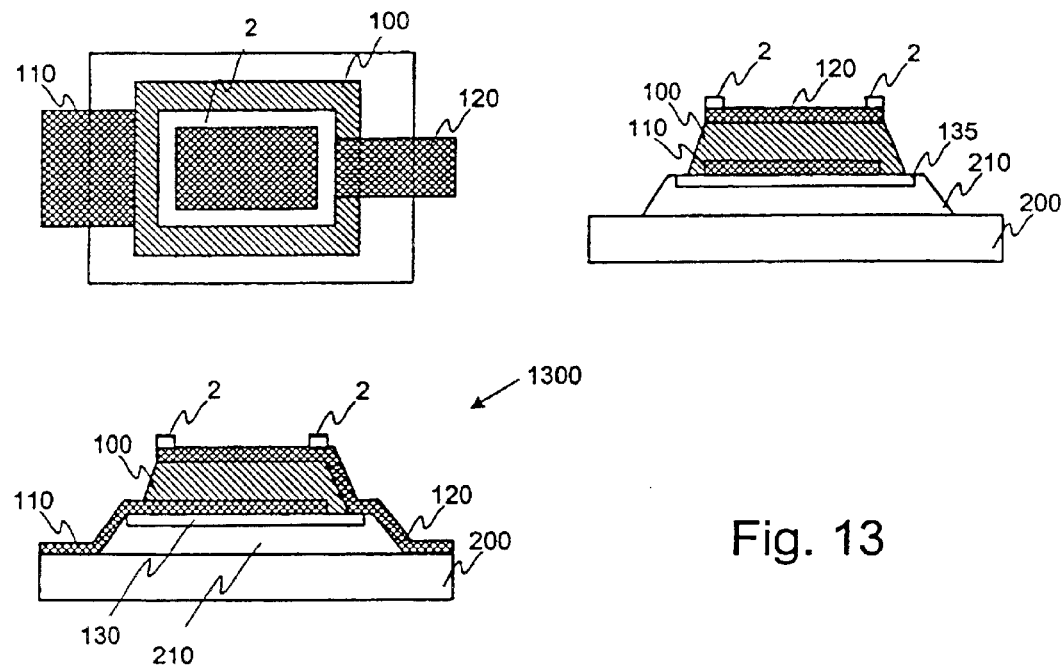
FIG. 13 shows schematically a resonator according to a second preferred embodiment of the invention.

FIG. 13 shows a BAW resonator 1300 according to a second preferred embodiment of the invention. The BAW resonator 1300 is fabricated on a glass or silicon substrate 200. Over the substrate, there is, for example, a membrane layer 130 and an etch pit 210 isolating the resonator structure from the substrate. The bottom electrode 110 covers a certain part of the substrate, and it is covered by the piezoelectric layer 100. Part of the bottom electrode 110 is left exposed for allowing the joining of the resonator to electrical components. The top electrode 120 covers at least part of the piezoelectric layer 100.

In the BAW resonator according to the second preferred embodiment, the frame-like boundary zone 2 is formed by depositing an extra frame-like layer 2 to the resonator structure. The same-like layer 2 according to the invention may be situated between any layers of a resonator structure. In the BAW resonator 1300 the extra layer is deposited on top of the top electrode 120. The extra frame-like layer may be electrically conducting or isolating. An extra frame-like layer may, for example, encircle the electrically excitable area, being itself outside the electrically excitable area of a resonator, or it may be located at the edge of the electrically excitable area as in FIG. 13.

As the cross sectional cuts in FIG. 13 show, the edges of the piezoelectric layer 100 may be slanting. The patterning of the piezoelectric material typically produces edges that are not exactly perpendicular to the surface of the substrate. A resonator structure according to the invention may have such slanting edges and still operate successfully in piston mode. If the edges of the piezoelectric layer (or of any other layer, but typically the piezoelectric layer is the thickest layer in a resonator structure) are slanting already just beside the frame-like zone, the width of the frame-like zone may need adjustment when compared to the width calculated using either the laterally one-dimensional theory or the design rule described above because the acoustic properties of the surrounding region 1;5 are then changing.

The top electrode 120 of the resonator 1300 extends as a strip to the right-hand side (in FIG. 13), covering part of the slanting edge of the piezoelectric layer. To optimize the properties of a resonator, it may be necessary to alter the thickness or width of the frame-like layer 2 in the area adjacent to the top electrode strip. Suitable thickness and width can be found, for example, experimentally. If the resonator structure is not similar to all directions around the frame-like zone, variations in the thickness and/or width of the frame-like zone may be advantageous also in other resonators according to the invention, as discussed above.

Figure 14:
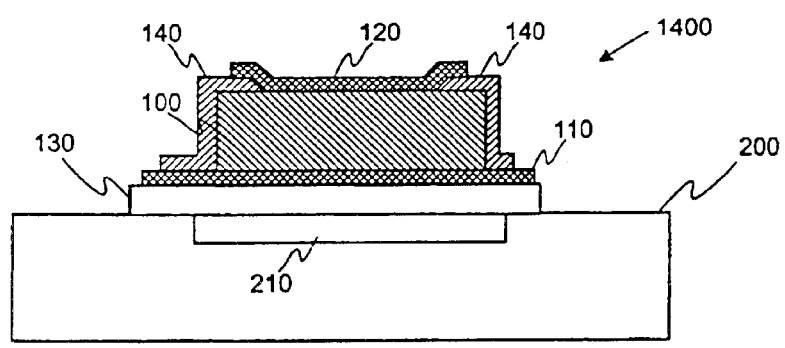
FIG. 14 shows schematically a resonator structure according to a third preferred embodiment of the invention.

FIG. 14 shows schematically a BAW resonator 1400 according to a third preferred embodiment of the invention, where the frame-like boundary zone is formed by letting two layers overlap. In FIG. 14, the BAW resonator 1400 is by way of example on a membrane 130 placed over a etch pit 210. The BAW resonator 1400 has a top electrode 120 and a bottom electrode 110, and a piezoelectric layer 100 in between the electrodes. During the manufacture process, the piezoelectric layer 100 may be covered with a passivation layer 140. The passivation layer is typically dielectric material, and it both insulates the component electrically and protects the piezoelectric material. The passivation layer is opened (or removed by etching) on top of the piezoelectric layer 100, on the location where the top electrode 120 is placed. As can be seen in FIG. 14, the passivation layer 140 and the top electrode 120 overlap at the edge of the top electrode. The zone, where both the top electrode 120 and the passivation layer 140 extend, is the frame-like zone according to the invention. It is also possible that the layers which overlap and form the frame-like zone, are not the top-most layers of the resonator structure.

Figure 1:
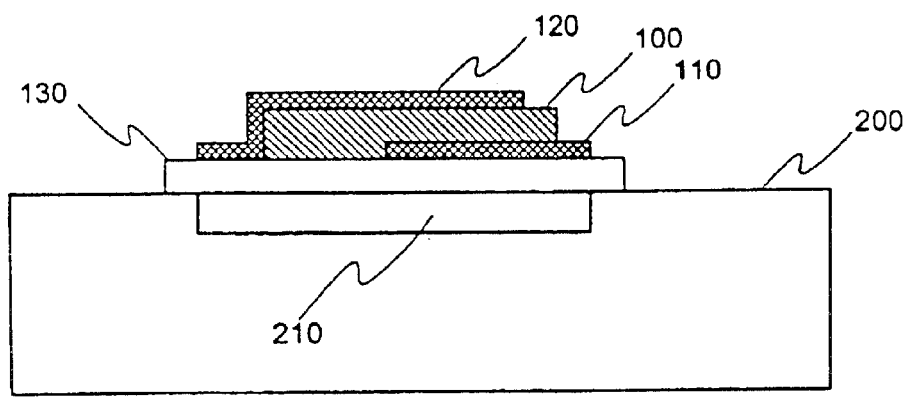
FIG. 1 illustrates a bulk acoustic wave resonator according to prior art.
Figure 2:
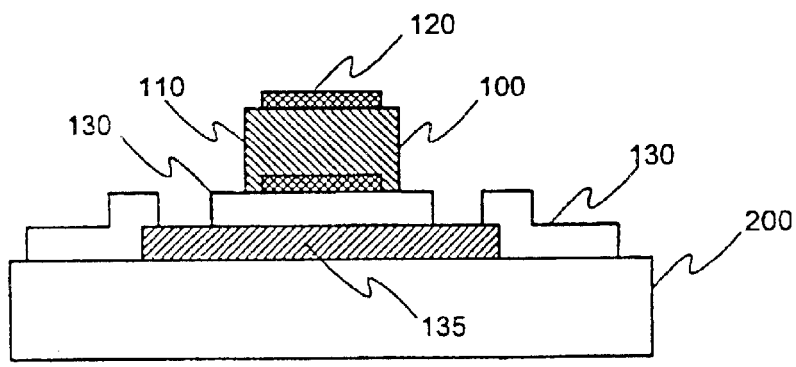
FIG. 2 shows another prior art bulk acoustic wave resonator structure having a bridge structure.
Figure 3:
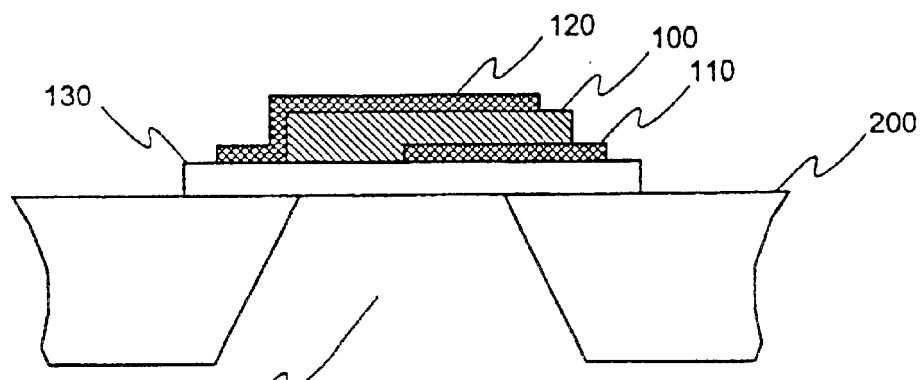
FIG. 3 illustrates a prior art bulk acoustic wave resonator having a via-hole structure.
Figure 4:
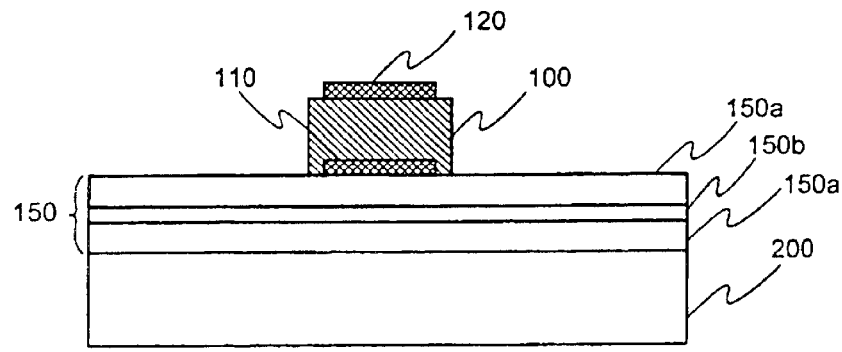
FIG. 4 illustrates a prior art bulk acoustic wave resonator isolated from the substrate by an acoustic mirror structure.
Figure 5:
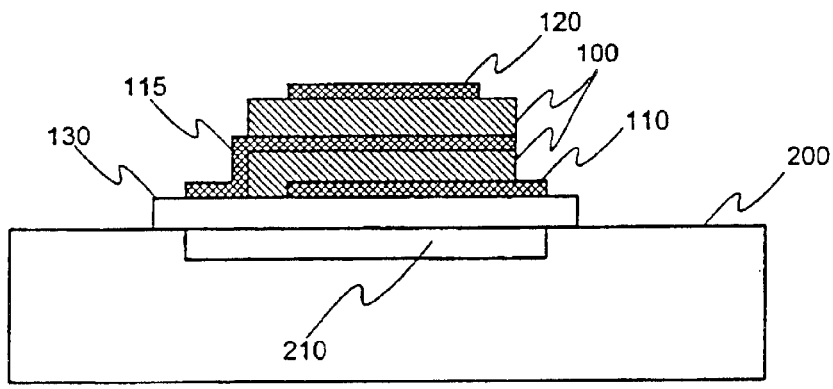
FIG. 5 illustrates a prior art stacked bulk acoustic wave resonator.

To add the frame-like zone to a resonator by using the overlapping passivation layer and top electrodes requires only slight changes to the manufacturing of the resonator structure. This method is thus easy and efficient for producing good quality resonators. Overlapping layers, and especially using a passivation layer as an overlapping layer, can be used also with other resonators, for example, in a stacked BAW resonator similar to that presented in FIG. 5.

Figure 15:
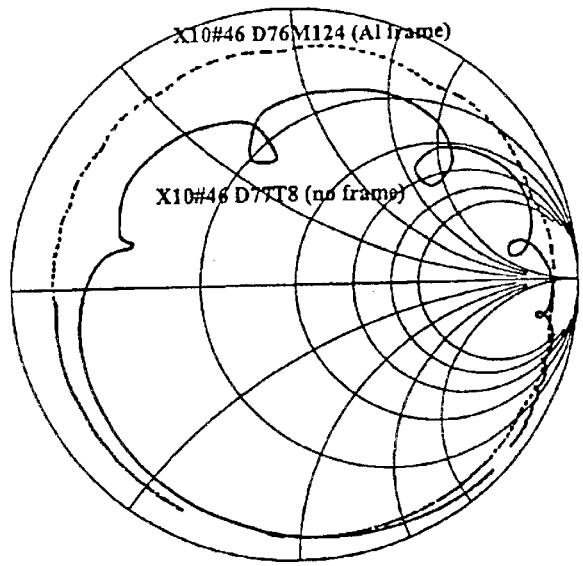
FIG. 15 shows on Smith's chart the measured electrical response of a resonator structure according to the third preferred embodiment of the invention.

In FIG. 15 the measured electrical response of a BAW resonator according to the third preferred embodiment of the invention is compared to the electrical response of flat prior-art BAW resonator. Both these BAW resonators employ an acoustic quarter-wavelength mirror layer. The piezoelectric material is ZnO, which exhibits dispersion relation of type I for TE1 waves. The BAW resonator X10#46 D76M124 according to a third preferred embodiment has a frame-like zone that is 235 nm thicker than the center area of the resonator and that is 5 μm wide which has been experimentally found to be optimum for the studied resonator X10#46 D76M124. The frame-like zone is constructed by letting a passivation layer and the top electrode overlap at the edge of the top electrode. The BAW resonator X10#46 D77T8 is a flat prior-art BAW resonator. It has otherwise similar layer structure and dimensions as the BAW resonator X10#46 D76M124, but it lacks the frame-like zone.

The measured electrical response of the BAW resonator X10#46 D76M124 is presented in FIG. 15 with a dashed line. The dashed line does not deviate much from a circle, indicating that the BAW resonator X10#46 D76M124 according to the third preferred embodiment of the invention operates in the piston mode. The measured electrical response of the BAW resonator X10#46 D77T8 is presented in FIG. 15 with a solid line. The solid line forms loops, indicating that the prior-art BAW resonator without a frame-like zone has spurious resonances.

Figure 16:
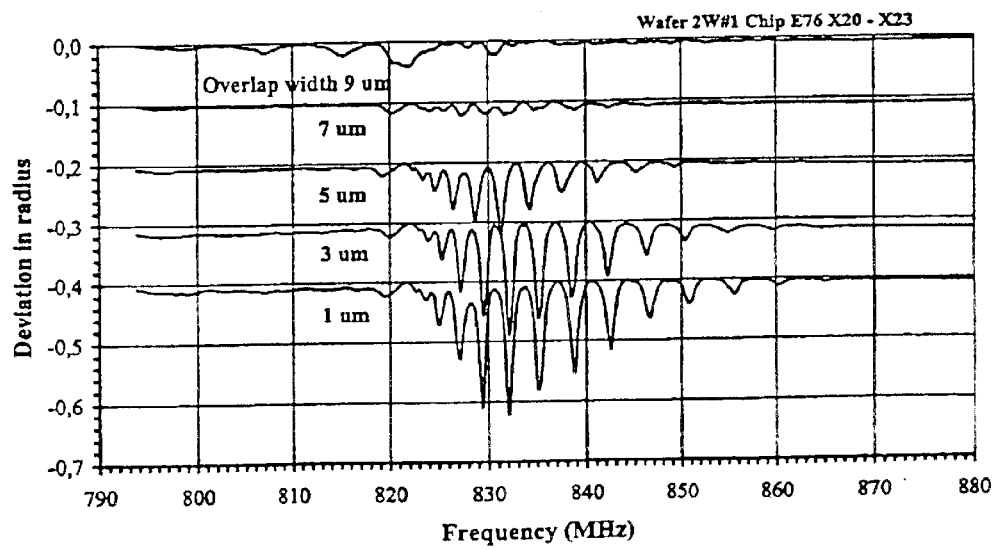
FIG. 16 illustrates the measured strength of spurious resonances in resonator structures having a frame-like zone formed by two partially overlapping layers.

FIG. 16 shows the measured electrical responses of various BAW resonators, and it gives an example of selecting the width of the frame-like zone properly. In these BAW resonators a $SiO_2$ passivation layer overlaps with the top electrode, similarly as presented in FIG. 14, forming a frame-like zone. The width of the frame-like zone is different in each BAW resonator, whose electrical response is presented in FIG. 16. The width varies from 1 μm to 9 μm from resonator to resonator, but it is practically uniform for each resonator.

FIG. 16 presents the purity of the electrical response as deviation from a circle on Smith's chart as a function of frequency. In this presentation, the amplitude of the waves indicates the strength of the spurious resonances. The curves in FIG. 16 correspond to the following widths of the frame-like zone: 1, 3, 5, 7 and 9 $\mu$m. The curves marked with 7, 5, 3 and 1 $\mu$m have been shifted in the vertical direction by −0.1, −0.2, −0.3 and −0.4, correspondingly, to enhance legibility.

The BAW resonator having a 7-$\mu$m wide frame-like zone has the purest electrical response in FIG. 16, and it is a resonator according to the invention. The deviations from the circle on Smith's chart are less than 0.02 units. When the width of the frame-like zone is smaller, the deviation from the circle increases. For example, the resonator having a 1 $\mu$m wide frame-like zone exhibits at least 14 spurious resonance modes at the frequency range of 820 . . . 870 MHz. When the width of the frame-like zone is larger than that producing the purest electrical response, FIG. 16 (curve marked with 9 $\mu$m) shows that spurious resonances emerge at somewhat lower frequencies.

FIG. 17 shows a cross-section of a resonator structures 1700 and 1710 according to a fourth preferred embodiment of the invention. A resonator according to the invention may have a frame-like zone, whose cross-section is not rectangular. In general, the edges of any layer in the layer structure may be tapered. Usually the edges of the frame-like zone become automatically tapered when wet etching technique is used. Resonator structure 1700 is given as an example. The correct dimensions for the edge regions are found numerically, by solving the wave equation, or experimentally by observing the strength of the spurious modes.

If the dispersion of the frame-like zone 2;4 around the center area 3 of the resonator is of type II, then the edge of the piezoelectric layer 100 may be thinned gradually, as shown in FIG. 17*b* for the resonator 1710. Due to the tapering of the piezoelectric layer, the cut-off frequency of the frame-like zone varies smoothly as a function of the distance from the center of the resonator. A BAW resonator according to the fourth preferred embodiment of the invention may be quite simple to produce, as many thin film patterning procedures produce tapered edges in proper dimension. The width of the sloping edge of a film typically becomes comparable to the thickness of the film.

FIG. 18 shows a top-view of some example resonator structures according to a fifth preferred embodiment of the invention. In these resonator structures, the frame-like zone is formed by patterning one of the layers in the layer structure. The patterned layer may be, for example, the top electrode 120, as presented in FIG. 18*a* The resonator 1810 has a frame-like zone 2, which is formed by patterning the rim of the top electrode 120 in a suitable way. If the dimensions of the patterning image are small compared to the wavelength of the sound in the lateral direction, the cut-off frequency of the patterned region, which is indicated with dashed lines in FIGS. 18*a* and 18*b*, is changed. If the dimensions of the patterning image are larger or of the same order as the wavelength of sound, the result is that the cut-off frequency is different in the different parts of the patterning and it may not be possible to obtain a single strong piezoelectrically excited wave mode. Patterning can be used to fabricate a frame-like zone having a higher (FIG. 18*a*) or lower (FIG. 18*c*) cut-off frequency than the center area without deposition of a new layer. The patterned layer may be one of the layers extending over the center area of the resonator, for example to top electrode, or it may be one of the layers extending over the region surrounding the center area. It may also be a layer extending over the whole resonator, as the passivation layer 140 in resonator 1820. The manufacture of a resonator having a patterned frame-like zone typically does not require extra steps compared to manufacture of prior-art resonators. It is also possible to deposit a separate layer which forms only the patterning, but does not extend neither to the center area nor to the region surrounding the center area. Furthermore, it is possible to vary the thickness of a layer so that a patterning image specifies the thickness of a layer instead of specifying the absence/presence of a layer.

Consider, for example, a resonator where the wave number in the frame-like zone is 70000 l/m at the operating frequency. The wavelength of this lateral wave is 90 $\mu$m. Typical dimensions of the patterning image can thus be, for example, several micrometers. The dimensions may also be less, if such dimensions are technically feasible to achieve.

For an oscillating scalar function of one variable, it is possible to define an envelope, which goes through either local maxima or local minima and whose period is longer than that of the oscillating function. For a pattern or curve in a plane, the determination of an envelope is not as straightforward. Such an envelope, whose period (or scale of changes) is typically of the order of the wavelength of sound can, however, usually be defined. The frame-like zone according to the invention is thus the area covered by the envelope of the pattern. The width of the frame-like zone formed using patterning may vary; it does not have to be substantially uniform. FIGS. 18*c* and 18*d* show top views of two examples of patterning, which can be used to form a frame-like zone.

Figures presenting resonator structures according to the invention present, as examples, resonators having one piezoelectric layer. A resonator according to the invention may as well have, for example, two piezoelectric layers and a middle electrode, or it may have more than one middle electrodes stacked in between piezoelectric layers.

Bulk acoustic wave resonators are used above as examples of piezoelectric resonators, where a frame-like zone enhances the properties of a resonator. A frame-like zone according to the invention may be used to enhance the properties of thicker crystal resonators, too. Suitable cut-off frequency relating to the piezoelectrically excited wave mode in the frame-like zone and width of the frame-like zone may be found using the principles presented above.

In this description the width of the frame-like zone refers to dimension of the frame-like zone in the direction of the surface of the top electrode. Any expressions indicating directions, such as top and bottom, are used to make the description of the resonator structure more eligible. These expressions do not restrict the resonator structures according to the invention in any way.

What is claimed is:

1. A thin film resonator (1200, 1300, 1400), where a certain wave mode is piezoelectrically excitable and which resonator comprises at least two conductor layers (110, 120) and at least one piezoelectric layer (100) in between the conductor layers, said resonator having a first area over which said conductor layers and piezoelectric layer extend, which first area is a piezoelectrically excitable area of the resonator, characterized in that the resonator comprises a frame-like zone (2, 4) of any shape which frame-like zone confines a center area (3) within the first area of the resonator, the resonator is adapted to operate in the thickness extensional wave mode as a TE mode and in such a way that a cut-off frequency of the piezoelectrically excited thickness extensional wave mode in the layer structure of the frame-like zone is different from the cut-off frequency of the piezoelectrically excited thickness extensional wave mode in the layer structure of the center area, and the resonator is adapted in such a way that a width of the frame-like zone and acoustical property means of the layer structure in the frame-like zone are arranged so that displacement relating to the piezoelectrically excited strongest resonance mode is substantially uniform in the center area of the resonator.

2. A resonator according to claim 1, characterized in that the width of the frame-like zone is not uniform.

3. A resonator according to claim 1, characterized in that the cross-section of the frame-like zone is not uniform.

4. A resonator according to claim 1, characterized in that the frame-like zone has a substantially uniform width.

5. A resonator according to claim 4, characterized in that the cross-section of the frame-like zone is substantially rectangular.

6. A resonator according to claim 4, characterized in that the width of the frame-like zone and the cut-off frequency in the layer structure of the frame-like zone are arranged so that a lateral resonance frequency in infinitely long rectangular resonator, whose width is twice the width of the frame-like zone, where the cut-off frequency is the same as the cut-off frequency in the layer structure in the frame-like zone and which is surrounded by the layer structure of the area surrounding the frame-like zone, is substantially the same as the cut-off frequency in the center area.

7. A resonator (1230) according to claim 1, characterized in that the frame-like zone is substantially circular.

8. A resonator (1220) according to claim 1, characterized in that the frame-like zone is substantially polygonal.

9. A resonator (1210) according to claim 8, characterized in that the frame-like zone is substantially rectangular.

10. A resonator structure according to claim 9, characterized in that the cross-section of the frame-like zone is substantially rectangular.

11. A resonator (820, 840, 850) according to claim 1, characterized in that the cut-off frequency of the piezoelectrically excited wave mode in the layer structure of the frame-like zone is higher than the cut-off frequency of the piezoelectrically excited wave mode in the layer structure of the center area.

12. A resonator according to claim 11, characterized in that the dispersion of the piezoelectrically excited wave mode is of type II in the frame-like area.

13. A resonator (810, 830, 860) according to claim 1, characterized in that the cut-off frequency of the piezoelectrically excited wave mode in the layer structure of the frame-like zone is lower than the cut-off frequency of the piezoelectrically excited wave mode in the layer structure of the center area.

14. A resonator according to claim 13, characterized in that the dispersion of the piezoelectrically excited wave mode is of type I in the frame-like area.

15. A resonator (1000, 1300, 1700, 1820) according to claim 1, characterized in that the frame-like zone is within the first area.

16. A resonator according to claim 1, characterized in that the frame-like zone is at least partly outside the first area.

17. A resonator (1810, 1820) according to claim 1, characterized in that at least one of the layers of the resonator has a first part, which is patterned by variation in thickness, and a second part of uniform thickness.

18. A resonator (1810) according to claim 17, characterized in that the first part is a rim covering the frame-like zone.

19. A resonator according to claim 18, characterized in that the layer having the first part and the second part is a top electrode of the resonator.

20. A resonator (1820) according to claim 17, characterized in that the second part covers the frame-like zone.

21. A resonator according to claim 20, characterized in that the layer having the first part and the second part is a passivation layer of the resonator.

22. A resonator (1710) according to claim 1, characterized in that the thickness of the center area is substantially uniform, the thickness of a region surrounding the frame-like zone is substantially uniform at a certain region next to an interface between the frame-like zone and the surrounding region, and the thickness of the frame-like zone varies over the width of the frame-like zone.

23. A resonator according to claim 22, characterized in that the frame-like zone is thicker at an interface between the center area and the frame-like zone than at the interface between the frame-like zone and the surrounding material.

24. A resonator according to claim 22, characterized in that the frame-like zone is thinner at the interface between the center area and the frame-like zone than at the interface between the frame-like zone and the surrounding material.

25. A resonator (1400) according to claim 1, characterized in that in the frame-like zone a first layer (120) extending at least over the center area and the frame-like zone overlaps with a second layer (140) extending over the frame-like zone and over some part of the area surrounding the frame-like zone.

26. A resonator according to claim 25, characterized in that the first layer is one of the conductor layers and the second layer is a passivation layer.

27. A resonator (1300) according to claim 1, characterized in that it comprises at least one frame-like layer, which forms the frame-like zone.

28. A resonator (1000) according to claim 1, characterized in that the frame-like zone is arranged by varying the thickness of at least one of the layers extending at least over the frame-like zone and the center area, so that the thickness of said layer is different in the frame-like zone than in the center area.

29. A resonator according to claim 28, characterized in that said layer is a top electrode (120) of the resonator.

30. A resonator according to claim 28, characterized in that said layer is thicker in the frame-like zone than in the center area.

31. A resonator according to claim 28, characterized in that said layer is thinner in the frame-like zone than in the center area.

32. A resonator according to claim 1, characterized in that it is a thin film bulk acoustic wave resonator.

33. A resonator according to claim 1, characterized in that the thickness of the resonator in the center area is substantially uniform.

34. A resonator according to claim 1, characterized in that the thickness of the resonator in the center area is different in a first part of the center area than in a second part in the center area.

35. A filter comprising at least one thin film resonator (1200, 1300, 1400), where a certain wave mode is piezoelectrically excitable and which resonator comprises at least two conductor layers (110, 120) and at least one piezoelectric layer (100) in between the conductor layers, said resonator having a first area over which said conductor layers and piezoelectric layer extend, which first area is a piezoelectrically excitable area of the resonator, characterized in that the resonator comprises a frame-like zone (2, 4) of any shape which frame-like zone confines a center area (3) within the first area of the resonator, the resonator is adapted to operate in the thickness extensional wave mode as a TE mode and in such a way that a cut-off frequency of the piezoelectrically excited thickness extensional wave mode in the layer structure of the frame-like zone is different from the cut-off frequency of the piezoelectrically excited thickness extensional wave mode in the layer structure of the center area, and the resonator is adapted in such a way that a width of the frame-like zone and acoustical property means of the layer structure in the frame-like zone are arranged so that displacement relating to the piezoelectrically excited strongest resonance mode is substantially uniform in the center area of the resonator.

36. A filter according to claim 35 wherein the resonator comprises at least four layers that includes at least two piezoelectric layers.

37. A filter according to claim 36 wherein each of said two conductor layers and each of said two piezoelectric layers is a thin film.

38. A resonator according to claim 1 wherein the resonator comprises at least four layers that includes at least two piezoelectric layers.

39. A resonator according to claim 38 wherein each of said two conductor layers and each of said two piezoelectric layers is a thin film.

* * * * *